United States Patent [19]

Noufi et al.

[11] Patent Number: 4,642,140

[45] Date of Patent: Feb. 10, 1987

[54] PROCESS FOR PRODUCING CHALCOGENIDE SEMICONDUCTORS

[75] Inventors: Rommel Noufi, Westminster, Colo.; Yih-Wen Chen, Omaha, Nebr.

[73] Assignee: The United States of America as represented by the United States Department of Energy, Washington, D.C.

[21] Appl. No.: 728,977

[22] Filed: Apr. 30, 1985

[51] Int. Cl.$^4$ .................. C23C 22/48; C23C 22/52
[52] U.S. Cl. .................. 148/6.24; 29/572; 136/260; 136/264; 136/265; 427/74; 427/76; 427/86; 427/87
[58] Field of Search .................. 148/6.24; 429/111; 427/74, 76, 86, 87; 136/260, 264, 265; 29/572

[56] References Cited

U.S. PATENT DOCUMENTS

| | | | |
|---|---|---|---|
| 4,338,180 | 7/1982 | Nakamura | 204/290 R |
| 4,386,142 | 5/1983 | Hodes et al. | 429/111 |
| 4,444,600 | 4/1984 | Aries et al. | 148/6.24 |
| 4,581,108 | 4/1986 | Kapur et al. | 204/37.1 |

OTHER PUBLICATIONS

R. C. Bhardwaj et al, *Solar Cells*, vol. 13, pp. 293–300 (1984–1985).
J. R. Owen et al, *Proceedings First E. C. Photovoltaic Solar Energy Conference*, Luxembourg, 1977, Reidel Pub. Co. (1978), pp. 436–444.
W. A. Gerrard et al, *Mat. Res. Bull.*, vol. 12, pp. 677–684 (1977).
H. L. Hwang et al, *Proceedings, 5th E. C. Photovoltaic Solar Energy Conference*, (1983), Reidel Pub. Co. (1984), pp. 908–912.

*Primary Examiner*—Aaron Weisstuch
*Attorney, Agent, or Firm*—Kenneth L. Richardson; Hugh W. Glenn; Judson R. Hightower

[57] ABSTRACT

A process for producing chalcogenide semiconductor material is disclosed. The process includes forming a base metal layer and then contacting this layer with a solution having a low pH and containing ions from at least one chalcogen to chalcogenize the layer and form the chalcogenide semiconductor material.

18 Claims, No Drawings

PROCESS FOR PRODUCING CHALCOGENIDE SEMICONDUCTORS

CONTRACTUAL ORIGIN OF THE INVENTION

The U.S. Government has rights in this invention under Contract No. DE-AC02-83CH10093 between the U.S. Department of Energy and the Solar Energy Research Institute, a Division of the Midwest Research Institute.

BACKGROUND OF THE INVENTION

1. Field of the Invention

The present invention relates to chalcogen-containing semiconductor materials and, more particularly, to processes for making the same. Specifically, the present invention relates to a novel process for chalcogenizing metal alloys to produce chalcogenide semiconductor materials useful in photovoltaic cells and the like.

2. Description of the Prior Art

The field of photoelectrochemistry and photovoltaics is recognized as having the potential for enabling solar energy utilization to meet many of the energy needs of the future. Through the action of light, photoelectrochemical and photovoltaic cells can be used to generate electric power and/or to synthesize fuels and desired chemicals from abundant, renewable resources. Such photovoltaic cells and their functioning are well documented in the literature. U.S. Pat. No. 4,461,691 provides an excellent background on the general operation of typical photoelectrochemical cells. The contents of this referenced patent are specifically incorporated herein by reference to provide general background information.

Part of the search for efficient, functional photovoltaic cells includes the investigation of various semiconductor materials and processes for making such photosensitive semiconductor materials. One category of materials having important potential use in photovoltaic cells is the chalcogenides. By this is meant any combination of two or more elements, one of which comprises a chalcogen (Group VIa of the Periodic Table-S, Se, Te, and Po).

Prior art devices and fabrication techniques, using polycrystalline semiconductor materials, including chalcogenides, have generally proven inadequate because of high production costs. These high production costs stem from capital equipment costs and high purity control requirements. One such prior art approach includes vacuum evaporation and deposition techniques. Such techniques require extensive vacuum chambers, monitors for each element involved, and relatively high heat. As a result, these techniques tend to be very expensive because of the equipment necessary to operate them.

Another prior approach to producing such semiconductor materials includes spray pyrolysis. In such instances, solutions of each element to be included in the semiconductor material are sprayed onto a hot substrate. Disadvantages to such techniques include poor quality control and nonuniformity. Moreover, such techniques are energy intensive in that they require high temperatures and electric currents.

Still another prior art approach includes electrochemical deposition such as disclosed in U.S. Pat. No. 3,573,177 and British Pat. No. 1,532,616. In such instances, the polycrystalline materials are formed by electrochemical deposition from an electrolyte solution onto an anode surface. Thin films of such materials can be readily formed using these techniques. However, process controls are difficult, and these techniques can be energy intensive. Moreover, the formation of good p-n junctions is difficult using such electrodeposition techniques.

SUMMARY OF THE INVENTION

Accordingly, it is one object of the present invention to provide a process for producing photovoltaic semiconductor materials.

It is another object of the present invention to provide a process for producing chalcogenide semiconductor materials useful in photovoltaic semiconductor devices.

It is yet another object of the present invention to provide a process for chalcogenizing base metal base layers to form photovoltaic semiconductor material.

Additional objects, advantages, and novel features of the invention shall be set forth in part in the description that follows, and in part will become apparent to those skilled in the art upon examination of the following or may be learned by the practice of the invention. The objects and advantages may be realized and attained by means of the instrumentalities and in combinations particularly pointed out in the appended claims.

To achieve the foregoing and other objects and in accordance with the purpose of the present invention, as embodied and broadly described herein, a process is disclosed for producing a chalcogenide semiconductor. The process includes forming a base metal layer, and then contacting this layer with a solution having a substantially low pH and containing ions from at least one chalcogen to chalcogenize the layer and form the chalcogenide semiconductor.

DETAILED DESCRIPTION OF THE PREFERRED EMBODIMENTS

A thin film layer of a chalcogenide composition may be produced at ambient temperatures and pressures by the process of the present invention. A thin base metal layer is first formed, preferably on a conducting substrate. The metal layer may consist of one or more metallic components. In preferred form, a binary or ternary metal alloy composition is used. The metal alloy is deposited onto the conducting substrate by any of various known deposition techniques.

Once deposited, the metal layer is then chalcogenized so as to incorporate one or more chalcogen elements with the metal layer. This chalcogenization step preferably includes a redox reaction between the base metal layer and a solution containing the chalcogen ions. It is critical to the process of the present invention that the pH of the solution be quite low and preferably in the range of 1-2. In this manner, a chalcogenide semiconductor material may be formed.

In the preferred embodiment, the metal layer includes one or more elements selected from Groups Ib, IIb, IIIa, and IVa of the Periodic Table. Preferably, the metal layer is a metal alloy of two or more such elements such as CuIn, AgIn, CuInGa, and the like. When a metal aloy is used, it preferably includes equal amounts stoichiometrically of each alloy element. The metal alloy may be formed by any one of several known deposition techniques. For example, electrodeposition of indium onto copper provides a CuIn metal alloy useful in the process of the present invention. The copper may be initially deposited onto the conducting substrate surface referred to above, followed by the In electrodeposition.

Any known conducting substrate material may be used as a base for the base metal layer in the process of the present invention, In preferred form, the conducting substrate is selected from Mo, ITO (indium tin oxide), $SnO_2$, Ti, and stainless steel. However, other similar types of conducting substrates may also be used.

Once the metal layer is formed on the conducting substrate, the metal layer is then chalcogenized. The chalcogen may be selected from any one of the Group VIa elements of the Periodic Table and is preferably selenium, tellurium, or sulfur. While the composition formed from the preferred embodiment of the invention includes only one chalcogen element with the base metal layer, more than one such element may be incorporated into the metallic layer if desired. The metal layer is chalcogenized by forming a low pH solution of the chalcogen ions in an appropriate solvent. A critical aspect for the invention is that the pH preferably be in the range of about 1-2. If the pH is substantially greater or lower than this preferred range, the resultant composition will be less than optimum with respect to desired stoichiometry and performance characteristics as a photovoltaic material. Any appropriate solvent may be used for the chalcogen so long as the chalcogen is soluble at the appropriate pH level and remains in the correct oxidation state for redox reaction with the base metal layer. For example, when selenium is the selected chalcogen, a solution of $H_2SeO_3$, $SeO_2$, or $Na_2SeO_3$ may be used. The ionic concentration of the selected chalcogen is preferably approximately 0.001 molar or greater. The resultant oxidation-reduction reaction between the chalcogen solution and the metal layer yields a thin-film chalcogenide.

In preferred form, the metal layer is generally 0.5–2.5 micrometers thick before chalcogenization. If the film is much tinner than this, the final product will produce only low currents and voltages. Moreover, should the film be substantially greater than the 2.5 micrometers, low current, low voltage, and low fill factor result. Once the chalcogenization step of the invention has occurred, a final chalcogenide layer of 1–4 micrometers is produced.

Once the chalcogenide composition is formed, it may be combined with another photovoltaic partner to form a p-n junction. An example of this is a Cd(Zn)S/$CuInSe_2$ cell. The latter composition is produced in accordance with the process of the present invention and is then combined with the Cd(Zn)S material, or any other photovoltaic material such as CdS, to form the desired p-n photovoltaic junction thereby producing an appropriate photovoltaic cell. Any known photovoltaic material may be used as a partner wtih the resultant chalcogenide composition of the present invention to form a photovoltaic cell. Moreover, the process of the present invention may be used to produce both portions (p-type and n-type) of a p-n junction.

The following examples are provided by way of illustration only and are not to be deemed to be limiting in any manner. cl EXAMPLE I Thin-film Cd(Zn)S/$CuInSe_2$ solar cells have shown excellent output stability and respectable conversion efficiencies of greater than eleven percent (11%). However, several of the known, standard electrodeposition techniques were used to prepare Cu-In-S and Cu-In-Se films, and the results were negative. The Cu-In-Se film indicated no photovoltaic activity whatsoever, even after annealing, and the Cu-In-S film showed only n-type behavior after annealing. Therefore, the process of the present invention was used to produce $CuInSe_2$ thin-film layers for use in a solar cell.

A Cu-In alloy was first electroplated onto a conducting substrate, in this instance ITO, from a 1:4 ethanolamine/methanol solution containing 0.01 M $Cu(ClO_4)_2$ and 0.01 M $In(ClO_4)_3$. Thin films of only Cu or In can also be obtained from the same solution containing ions only of Cu or In. The electroplating was done at a constant potential of $-2.0$ V versus SCE. The thickness of each metal film was determined from the electrical charge consumed during the plating process, which was monitored with a digital coulometer. The alloy films were in the preferred range of 1–2.5 micrometers.

The deposited Cu-In metal alloy films were then chalcogenized in an aqueous solution containing 0.1 M $H_2SeO_3$ at pH 1-2. The metal films were heated gradually from room temperature to about 200° C. in an argon atmosphere. The annealed metal films exhibited improved film adhesion. The chalcogenization time depended on the pH of the solution and the exact concentration of $H_2SeO_3$. Several minutes were required generally to complete the reaction at a pH of 1.5.

The photoactivities of the Cu-In-Se thin films were examined in 0.1 M $Co(bpy)_3(ClO_4)_2$, wherein bpy represents bipyridyl, in acetonitrile with 0.2 M tetraethylammonium perchlorate as the supporting electrolyte (CAT). Using an outer-sphere redox couple, such as this one, decreased the probability of specific adsorption, while using a nonoxygenated organic solvent made rapid surface oxidation less likely. In this way one can evaluate the effect of several surface treatments as well as the quality and homogeneity of films, and can determine some effective optical and electronic properties of the films. Further details of this particular experimental technique for testing thin-film photovoltaic materials is disclosed in a paper entitled "$CuInSe_2$-Based Photoelectrochemical Cells: Their Use in Characterization of Thin $CuInSe_2$ Films, and as Photovoltaic Cells Per Se" by D. Cahen et al., *Proceedings of the 17th IEEE PV Specialists Conference,* May 1–5, 1984, pp 786–791. The contents of this paper are specifically incorporated herein by reference.

Thin films of the chalcogenized products produced using the present invention as described above, both with and without annealing, were characterized by X-ray defraction (XRD) using a Rigaku diffractometer with a rotating Cu anode source. Analysis of the Cu-In-Se films prepared by the selenization (chalcogenization using Se) process described above indicated a strong absorption edge corresponding to the band gap of $CuInSe_2$.

Photoelectrochemical tests in CAT also indicated a p-type photoeffect with photocurrent onset potential at about $-0.1$ V versus SCE, a value similar to a known (Boeing) vacuum-deposited p-$CuInSe_2$ thin film. This additional test result further evidenced the strong presence of $CuInSe_2$ in the chalcogenized film.

The resultant films obtained from Example I were amorphous. Therefore, they were annealed at about 500° C. in Ar to obtain a polycrystalline structure. Analysis of this polycrystalline structure indicated the substantially sole presence of $CuInSe_2$.

This chalcogenide semiconductor material is then combined with an n-type semiconductor material such as Cd(Zn)S to form a p-n junction. This combination of materails can then be used as a basis for a photovoltaic solar cell to generate power.

EXAMPLE II

Substantially the same process as described in Example I was used in Example II except that tellurium ions ($Te^{+4}$) were substituted for the selenium ions ($Se^{+4}$). The process of the invention produced a chalcogenide having a major constituent of $CuInTe_2$.

As can be seen from the above description and examples, the present invention provides a simple yet effective process for inexpensively producing chalcogenide semiconductor materials. The process of the present invention is performed at substantially ambient temperatures under conditions that are not extreme. Moreover, the parameters of the process are readily controlled, thereby permitting close control over production of the chalcogenide semiconductor materials without undue expense with respect to monitoring equipment or personnel. The chalcogenide semiconductor material produced from the process of the present invention exhibits appropriate p-type activity at an efficiency level useful in photovoltaic cells. Thus, one of the major problems of producing photovoltaic solar cells i.e., the expense of producing the photovoltaic material, is overcome by the process of the present invention. Finally, any number of binary, ternary, and quaternary chalcogenide compositions may be produced from the process of the present invention.

The foregoing illustrates only the principles of the invention. Further, since numerous modifications and changes will readily occur to those skilled in the art, it is not desired to limit the invention to the exact construction and operation shown and described, and accordingly all suitable modifications and equivalents may be resorted to within the scope of the invention as defined by the claims that follow.

The embodiments of the invention in which an exclusive property or privilege is claimed are defined as follows:

1. A process for producing a chalcogenide semiconductor material for use in photovoltaic semiconductor devices, said process comprising:
   a. forming a solution containing ions from at least one chalcogen and providing said solution with a pH in a range of 1-2 so as to provide said semiconductor material with suitable performance characteristics when used as said photovoltaic semiconductor device;
   b. forming a metal base layer containing a sufficient number of metal elements to form at least a ternary chalcogenide semiconductor material upon being chalcogenized with said solution; and
   c. contacting said metal base layer with said solution at about ambient temperature so as to chalcogenize said metal base layer and form said at least ternary chalcogenide semiconductor material.

2. The process as claimed in claim 1, wherein said chalcogen is selected from one or more of the Group VIa elements.

3. The process as claimed in claim 2, wherein said chalcogen is selected from the group consisting of selenium, tellurium, and sulfur.

4. The process as claimed in claim 1, wherein said metal base layer comprises an alloy of one or more elements selected from the group consisting of Group Ib, Group IIb, Group IIIa, and Group IVa elements.

5. The process as claimed in claim 1, wherein said metal base layer is formed on a conducting substrate prior to contacting said layer with said solution.

6. The process as claimed in claim 5, wherein said conducting substrate is in the form of a thin layer and is selected from the group consisting of Mo, ITO, $SnO_2$, Ti, and stainless steel.

7. The process as claimed in claim 1, wherein said chalcogenide semiconductor material comprises a ternary chalcogenide, wherein said metal base comprises a binary alloy compound having elements selected from the group consisting of Group Ib, Group IIb, Group IIIa, and Group IVa elements, and wherein said chalcogen is selected from Goup VIa elements.

8. The process as claimed in claim 1, wherein said chalcogenide semiconductor material comprises a quaternary chalcogenide, wherein said metal base comprises a ternary compound having elements selected from the group consisting of Group Ib, Group IIb, Group IIIa, and Group IVa elements, and wherein said chalcogen is selected from Group VIa elements.

9. The process as claimed in claim 21, wherein said chalcogenide semiconductor material comprises $CuInSe_2$, said metal base layer comprises the alloy CuIn, and said solution contains $Se^{+4}$ ions.

10. The process as claimed in claim 21, wherein said chalcogenide semiconductor material comprises p-type material for use in solar cells and other photovoltaic cells.

11. A process for chalcogenizing metal base layer films to form a photosensitive semiconductor material, said process comprising:
   a. forming a solution containing ions from at least one chalcogen selected from group VIa elements and providing said solution with a pH in a range of 1-2 so as to provide the photosensitive semiconductor material with suitable performance characteristics for use in photovoltaic applications;
   b. forming a metal base layer containing a sufficient number of metal elements to form at least a ternary chalcogenide photosensitive semiconductor material when put in contact with said solution; and
   c. contacting said metal base layer with said solution at about ambient temperature so as to chalcogenize said metal base layer and form said at least ternary chalcogenide photosensitive semiconductor material.

12. The process as claimed in claim 22, wherein said solution contains a chalcogen ion concentration of at least about 0.001 M.

13. The process as claimed in claim 22, wherein said metal base layer comprises an alloy of one or more elements selected from the group consisting of Group Ib, Group IIb, Group IIIa, and Group IVa elements.

14. The process as claimed in claim 22, wherein said chalcogen is selected from the group consisting of selenium, tellurium and sulfur.

15. The process as claimed in claim 11, wherein said chalcogenide semiconductor material comprises p-type photovoltaic material.

16. The process as claimed in claim 11, wherein said metal base layer film is first deposited onto a conducting substrate surface.

17. The process as claimed in claim 11, wherein said photovoltaic material comprises ternary semiconductor material, and wherein said metal base layer film comprises a binary alloy.

18. The process as claimed in claim 11, wherein said photovoltaic material comprises a quaternary semiconductor material, and wherein said metal base layer film comprises a ternary alloy.

* * * * *